(12) United States Patent
Liu et al.

(10) Patent No.: US 7,838,403 B1
(45) Date of Patent: Nov. 23, 2010

(54) SPRAY PYROLYSIS FOR LARGE-SCALE PRODUCTION OF CHALCOPYRITE ABSORBER LAYER IN PHOTOVOLTAIC DEVICES

(75) Inventors: Wei Liu, Yorktown Heights, NY (US); David B. Mitzi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/559,052

(22) Filed: Sep. 14, 2009

(51) Int. Cl.
*H01L 21/20* (2006.01)
(52) U.S. Cl. .................................................. 438/584
(58) Field of Classification Search ............... None
See application file for complete search history.

(56) References Cited

U.S. PATENT DOCUMENTS

| | | | |
|---|---|---|---|
| 3,148,084 A * | 9/1964 | Hill et al. .............. | 427/64 |
| 4,336,285 A * | 6/1982 | Squillante ............. | 427/314 |
| 6,127,202 A | 10/2000 | Kapur et al. | |
| 6,268,014 B1 | 7/2001 | Eberspacher et al. | |
| 6,546,757 B1 * | 4/2003 | Morse .................. | 65/377 |
| 6,679,938 B1 * | 1/2004 | Kim et al. ............. | 75/365 |
| 6,875,661 B2 | 4/2005 | Mitzi | |
| 7,094,651 B2 | 8/2006 | Mitzi et al. | |
| 7,306,823 B2 | 12/2007 | Sager et al. | |
| 7,341,917 B2 | 3/2008 | Milliron et al. | |
| 2003/0235695 A1 * | 12/2003 | Greenberg et al. .... | 428/432 |
| 2005/0158909 A1 | 7/2005 | Milliron et al. | |
| 2005/0271827 A1 | 12/2005 | Krunks et al. | |
| 2007/0012356 A1 | 1/2007 | Nanu et al. | |
| 2007/0160747 A1 | 7/2007 | Mitzi et al. | |
| 2007/0264504 A1 | 11/2007 | Mitzi et al. | |
| 2008/0124833 A1 | 5/2008 | Ruiz et al. | |
| 2009/0145482 A1 | 6/2009 | Mitzi et al. | |
| 2009/0194160 A1 * | 8/2009 | Chin et al. ............ | 136/256 |

OTHER PUBLICATIONS

V.K. Kapur et al., "Non-Vacuum Processing of CuIn1-xGaxSe2 Solar Cells on Rigid and Flexible Substrates Using Nanoparticle Precursor Inks," Thin Solid Films 431-432, pp. 53-57 (2003).
D. Guimard et al., "Copper Indium Diselenide Solar Cells Prepared by Electrodeposition," Proceedings of the 29th IEEE Photovoltaic Specialists Conference, New Orleans, pp. 692-695 (May 21-24, 2002).

(Continued)

*Primary Examiner*—Scott B Geyer
(74) *Attorney, Agent, or Firm*—Vazken Alexanian; Michael J. Chang, LLC

(57) ABSTRACT

Techniques for fabricating a photovoltaic device having a chalcopyrite absorber layer, such as a copper indium gallium selenide/sulfide (CIGSS) absorber layer, are provided. In one aspect, a method for fabricating a photovoltaic device is provided. The method includes the following steps. A precursor solution of metal chalcogenide dissolved in hydrazine or a hydrazine-like solvent is formed. Spray pyrolysis in an inert environment is used to deposit the precursor solution onto a substrate to form a metal chalcogenide layer on the substrate. A buffer layer is formed adjacent to a side of the metal chalcogenide layer opposite the substrate. A transparent conductive contact is formed adjacent to a side of the buffer layer opposite the metal chalcogenide layer.

24 Claims, 4 Drawing Sheets

OTHER PUBLICATIONS

M.E. Calixto et al., "Single Bath Electrodeposition of CuInSe2 and Cu(In,Ga)Se2 for Thin Film Photovoltaic Cells," Proceedings of the 31st IEEE Photovoltaic Specialists Conference, Lake Buena Vista, Florida, pp. 378-381 (Jan. 3-7, 2005).

A. Kampmann et al., "Electrodeposition of CIGS on Metal Substrates," Mat. Res. Soc. Symp. Proc., vol. 763, B8.5.1-B8.5.6 (2003).

R.N. Bhattacharya et al., "15.4% CuIn1-xGaxSe2-Based Photovoltaic Cells From Solution-Based Precursor Films," Thin Solid Films, vol. 361-362, 396-399 (2000).

M. Krunks et al., "Growth and Recrystallization of CuInS2 Films in Spray Pyrolytic Process," Applied Surface Science, vol. 142, pp. 356-361 (1999).

J.D. Harris et al., "Characterization of CuInS2 Films Prepared by Atmospheric Pressure Spray Chemical Vapor Deposition" Materials Science and Engineering, vol. B98, pp. 150-155 (2003).

M. Kaelin et al., "Electrosprayed and Selenized Cu/In Metal Particle Films," Thin Solid Films, vol. 457, pp. 391-396 (2004).

Jin et al., "The Effect of Film Composition on the Texture and Grain Size of CuInS2 Prepared by Chemical Spray Pyrolysis," Mat. Res. Soc. Symp. Proc., vol. 763, B8.23.1-B8.23.6 (2003).

S. Duchemin et al., "Studies on the Improvement of Sprayed CdS-CuInSe2 Solar Cells," In Proc. of the 9th EPVSEC, W. Palz, G. T. Wrixon, P. Helm (eds.), Freiburg, Germany, 476-479 (1989).

* cited by examiner

100

150

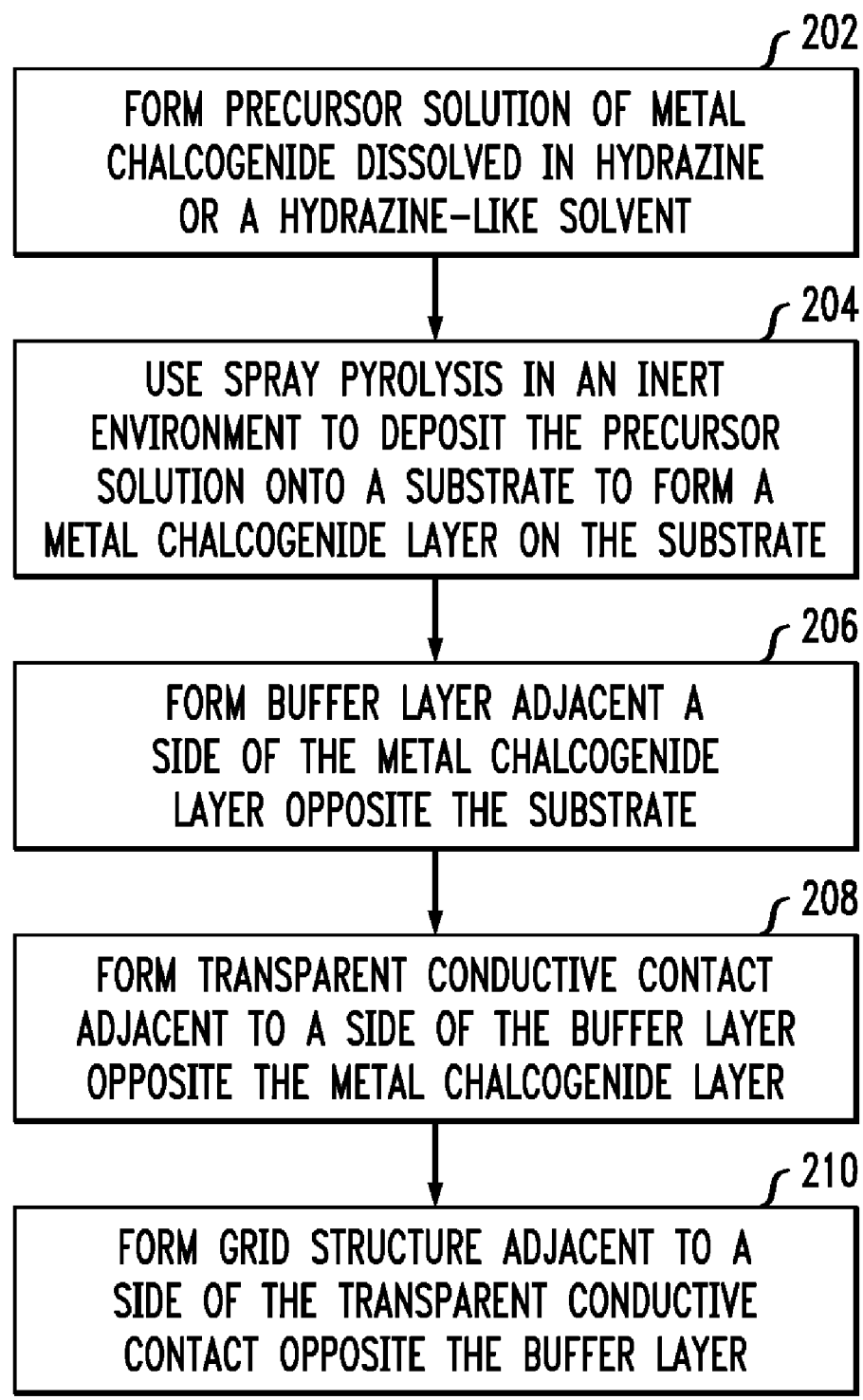

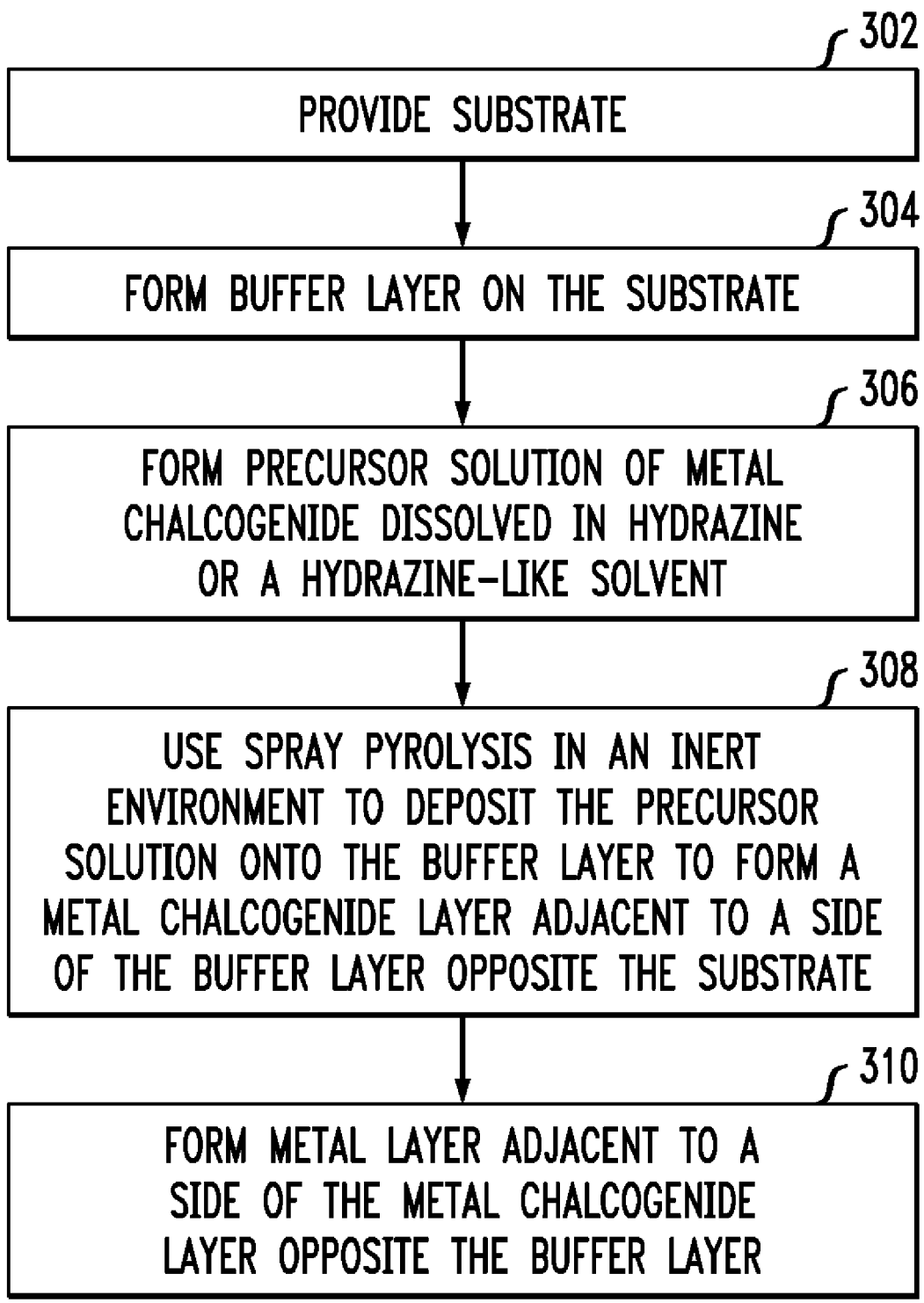

SPRAY PYROLYSIS FOR LARGE-SCALE PRODUCTION OF CHALCOPYRITE ABSORBER LAYER IN PHOTOVOLTAIC DEVICES

FIELD OF THE INVENTION

The present invention relates to photovoltaic devices, and more particularly, to techniques for fabricating a photovoltaic device having a chalcopyrite absorber layer such as a copper indium gallium selenide/sulfide (CIGSS) absorber layer.

BACKGROUND OF THE INVENTION

Skyrocketing crude oil prices coupled with a dramatic rise in worldwide energy demands and increased concerns regarding environmental pollution and global warming make clean renewable energy a necessity for future energy needs. Among all renewable energies, solar power is clean, abundant and distributed virtually everywhere around the world. Photovoltaic devices take advantage of the enormous solar energy source and directly transfer sunlight into electricity.

However, due to high production costs and low light-to-energy conversion efficiencies associated with conventional photovoltaic technology, photovoltaic devices have not yet gained widespread use. For example, traditional photovoltaic devices rely on costly high quality silicon (Si), an indirect bandgap material, and involve multi-step vacuum processes during production.

More recent attempts to reduce the costs associated with photovoltaic device production have involved implementing thin-film technology. Thin-film technology uses direct bandgap materials, such as amorphous Si, cadmium telluride (CdTe) and copper indium gallium selenide ($CuInGaSe_2$ also commonly abbreviated as "CIGS"), as the light absorber. Direct bandgap absorbers have strong light absorption at a thickness of only a few micrometers ($\mu m$). Reduced thickness means reduced material and production costs.

Of the three above-mentioned thin-film materials, CIGS is particularly attractive. Namely, CIGS-based photovoltaic devices with an efficiency of as high as 19.5 percent (%) have been demonstrated (as compared with 16.5% and 12% efficiencies for CdTe and amorphous Si absorbers, respectively). In addition, in CIGS there is no toxic cadmium (Cd) involved as with CdTe, and there are no degradation issues as with amorphous Si.

Very-high-efficiency CIGS absorber layers have been achieved using vacuum-based deposition processes, such as the "three-stage process" adopted by the National Renewable Energy Lab (NREL) which is a vacuum co-evaporation process wherein individual metal sources of copper (Cu), indium (In), gallium (Ga) and selenium (Se) are evaporated toward a heated substrate. The carefully controlled metal fluxes deliver a desired amount of metals, which react at the substrate under an overpressure of Se and form the CIGS compound.

Vacuum-based deposition processes for CIGS compounds are, however, expensive. Namely, expensive vacuum equipment, a sophisticated flux control setup and constant heating during the deposition all contribute to high production costs. Further, material utilization is not very efficient as a significant portion of the evaporated material can become deposited on the vacuum wall instead of on the substrate. Material utilization is an important consideration when expensive metals, such as In, are involved.

In an attempt to reduce production costs, manufacturers have turned to low-cost solution-based deposition processes. Although successfully implemented, solution-based processes still face many challenges, such as low efficiency and complicated processing. For example, one of the highest efficiencies obtained for a CIGS absorber device using a solution-based deposition process is 13.6% (by International Solar Electric Technology, Inc. (ISET)). See, for example, V. K. Kapur et al., "Non-Vacuum Processing of $CuIn_{1-x}Ga_xSe_2$ Solar Cells on Rigid and Flexible Substrates Using Nanoparticle Precursor Inks," Thin Solid Films 431-432, pp. 53-57 (2003), the disclosure of which is incorporated by reference herein. In the ISET process, nanosized metal oxide particles are used to form a precursor ink which is printed onto substrates to create oxide thin films. The ISET solution process however requires complicated procedures to prepare the precursors and employs a toxic selenization procedure to convert the oxide thin films to CIGS.

Electrodeposition is another solution-based approach to deposit either CIGS or metal precursors on a conducting substrate (see, for example, D. Guimard et al., "Copper Indium Diselenide Solar Cells Prepared by Electrodeposition," *Proceedings of the $29^{th}$ IEEE Photovoltaic Specialists Conference,* New Orleans, pp. 692-695 (May 21-24, 2002); M. E. Calixto et al., "Single Bath Electrodeposition of $CuInSe_2$ and $Cu(In,Ga)Se_2$ for Thin Film Photovoltaic Cells," *Proceedings of the $31^{st}$ IEEE Photovoltaic Specialists Conference,* Lake Buena Vista, Fla., pp. 378-381 (Jan. 3-7, 2005); and A. Kampmann et al., "Electrodeposition of CIGS on Metal Substrates," *Mat. Res. Soc. Symp. Proc.,* vol. 763, B8.5.1-B8.5.6 (2003), the disclosure of each of which is incorporated by reference herein). However, device efficiency is generally below 10% unless a post-deposition vacuum evaporation process is employed to correct the film compositional makeup (see R. N. Bhattacharya et al., "15.4% $CuIn_{1-x}Ga_xSe_2$-Based Photovoltaic Cells From Solution-Based Precursor Films," *Thin Solid Films,* vol. 361-362, 396-399 (2000), the disclosure of which is incorporated by reference herein).

Some other solution-based approaches include spray processes, doctor blading, ink jet printing and spin-coating. Spray processes, in particular, offer high throughput and high material utilization, and can be used to produce large-area uniform thin films with good adhesion to the substrate. Deposition of chalcopyrite materials copper indium disulfide ($CuInS_2$) and copper indium diselenide ($CuInSe_2$ which is also commonly abbreviated as "CIS") has been demonstrated using this method.

Most sprayed chalcopyrite photovoltaic devices utilize a "superstrate" structure as compared to a substrate structure. FIGS. 1A-B are diagrams comparing substrate and superstrate photovoltaic devices. Specifically, FIG. 1A is a diagram illustrating exemplary substrate photovoltaic device 100. Substrate photovoltaic device 100 includes molybdenum (Mo)-coated substrate 102, CIGS absorber layer 104 adjacent to substrate 102, buffer layer 106 adjacent to a side of CIGS absorber layer 104 opposite substrate 102 and transparent conductive contact 108 adjacent to a side of buffer layer 106 opposite CIGS absorber layer 104.

The substrate is typically a glass (e.g., soda-lime glass) metal foil or plastic substrate. Buffer layer 106 typically comprises cadmium sulfide (CdS). Transparent conductive contact 108 typically comprises intrinsic zinc oxide (ZnO) and a layer of transparent conductive oxide (TCO), such as aluminum-doped ZnO and indium tin oxide (ITO). During operation, light is incident toward photovoltaic device 100 from the transparent conductive contact side.

In contrast, FIG. 1B is a diagram illustrating exemplary superstrate photovoltaic device 150. Superstrate photovoltaic device 150 includes ZnO, ITO or tin oxide ($SnO_2$)-coated substrate 152, buffer layer 154 adjacent to substrate 152, CIGS absorber layer 156 adjacent to a side of buffer layer 154 opposite substrate 152 and metal back contact 158 adjacent to a side of CIGS absorber layer 156 opposite buffer layer 154. The substrate is typically a glass substrate. Buffer layer 154 typically comprises CdS. During operation, light enters device 150 from the ZnO, ITO or $SnO_2$-coated substrate side.

For CIGS-based photovoltaic devices, the substrate structure (FIG. 1A) has certain advantages over the superstrate structure (FIG. 1B) including the ability to achieve better grain growth on Mo-coated substrates. When the substrate is Mo-coated soda-lime glass, better grain growth in the CIGS absorber enhances diffusion of sodium (Na) from the soda-lime glass to the absorber layer which further improves device performance. Further, because favorable CIGS grain growth is generally achieved at high temperatures, a substrate structure allows high temperature heating of the absorber layer before depositing the buffer layer (and other layers). In contrast, the superstrate structure requires first depositing the buffer layer/growing the absorber layer then performing a high temperature anneal. Using high temperatures on the buffer and absorber layers may destroy the p-n junction therebetween. For these reasons, the substrate structure typically produces higher efficiency photovoltaic devices than the superstrate structure.

Three types of solutions have been implemented with conventional spray processes. The first type is simply an aqueous solution composed of copper dichloride ($CuCl_2$), indium trichloride ($InCl_3$) and thiourea or selenourea. See, for example, M. Krunks et al., "Growth and Recrystallization of $CuInS_2$ Films in Spray Pyrolytic Process," Applied Surface Science, vol. 142, pp. 356-361 (1999), the disclosure of which is incorporated by reference herein. The efficiency of the completed device is however generally below five % possibly due to the junction heating during processing (as a superstrate structure is commonly employed) and/or the introduction of undesired impurities of chlorine (Cl), carbon (C) and, when sprayed in ambient atmosphere, oxygen (O) as well. Further, indium oxide ($In_2O_3$) can be formed during the spray process which can disadvantageously create a shunting path for the device.

The second type of spray solution contains single metal-organic precursors such as $(Ph_3P)_2Cu(SEt)_2In(SEt)_2$ and $[P(n-Bu)_3]_2Cu(SEt)_2In(Set)_2$. Photovoltaic devices fabricated using this type of precursor have efficiencies of only 0.68% (see J. D. Harris et al., "Characterization of $CuInS_2$ Films Prepared by Atmospheric Pressure Spray Chemical Vapor Deposition" Materials Science and Engineering, vol. B98, pp. 150-155 (2003), the disclosure of which is incorporated by reference herein). The third type of spray pyrolysis solution consists of metal or metal oxide (Cu and In) nanoparticles suspended in a precursor solution. A spray process is implemented to deposit the precursor solution on a substrate. A high temperature Se-containing environment is used to convert the metal oxides to chalcopyrite (see M. Kaelin et al., "Electrosprayed and Selenized Cu/In Metal Particle Films," Thin Solid Films, vol. 457, pp. 391-396 (2004), the disclosure of which is incorporated by reference herein). A stable oxide impurity phase containing $In_2O_3$ is reported to exist which can provide a shunting path affecting device performance.

Therefore, improved, low-cost spray techniques for photovoltaic device production that offer large scale production capabilities while at the same time providing improved device performance and efficiency would be desirable.

SUMMARY OF THE INVENTION

The present invention provides techniques for fabricating a photovoltaic device having a chalcopyrite absorber layer, such as a copper indium gallium selenide/sulfide (CIGSS) absorber layer. In one aspect of the invention, a method for fabricating a photovoltaic device is provided. The method includes the following steps. A precursor solution of metal chalcogenide dissolved in hydrazine or a hydrazine-like solvent is formed. Spray pyrolysis in an inert environment is used to deposit the precursor solution onto a substrate to form a metal chalcogenide layer on the substrate. A buffer layer is formed adjacent to a side of the metal chalcogenide layer opposite the substrate. A transparent conductive contact is formed adjacent to a side of the buffer layer opposite the metal chalcogenide layer.

In another aspect of the invention, another method for fabricating a photovoltaic device is provided. The method includes the following steps. A substrate is provided. A buffer layer is formed on the substrate. A precursor solution of metal chalcogenide dissolved in hydrazine or a hydrazine-like solvent is formed. Spray pyrolysis in an inert environment is used to deposit the precursor solution onto the buffer layer to form a metal chalcogenide layer adjacent to a side of the buffer layer opposite the substrate. A metal layer is formed adjacent to a side of the metal chalcogenide layer opposite the buffer layer to complete the photovoltaic device.

In yet another aspect of the invention, a spray pyrolysis system is provided. The spray pyrolysis system includes a reservoir adapted for storing a precursor solution of metal chalcogenide dissolved in hydrazine or a hydrazine-like solvent; a nozzle adapted to receive the precursor solution from the reservoir via one or more fluid conduits and spray the precursor solution onto one or more photovoltaic device structures, wherein the reservoir, conduits and nozzle are composed of a material chemically resistant to the hydrazine or hydrazine-like solvent; and a heater adapted to heat the photovoltaic device structure on a side opposite onto which the precursor solution is sprayed.

A more complete understanding of the present invention, as well as further features and advantages of the present invention, will be obtained by reference to the following detailed description and drawings.

BRIEF DESCRIPTION OF THE DRAWINGS

FIG. 2 is a diagram illustrating an exemplary methodology for fabricating a photovoltaic device with a substrate configuration according to an embodiment of the present invention;

FIG. 3 is a diagram illustrating an exemplary methodology for fabricating a photovoltaic device with a superstrate configuration according to an embodiment of the present invention;

DETAILED DESCRIPTION OF PREFERRED EMBODIMENTS

Figure 1A:
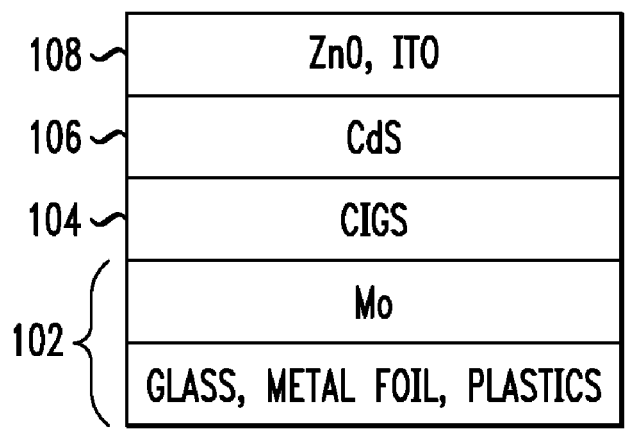
FIGS. 1A-B are diagrams illustrating conventional substrate and superstrate photovoltaic device configurations.
Figure 1B:
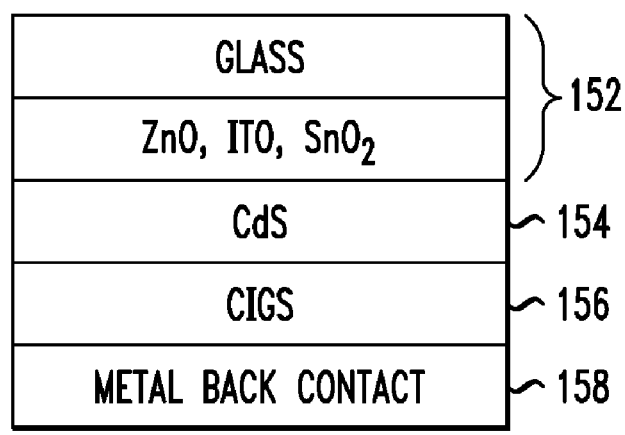

FIG. 2 is a diagram illustrating exemplary methodology 200 for fabricating a photovoltaic device with a substrate configuration. Methodology 200 provides an improved, low-cost, solution-based technique to grow uniform large-area copper indium gallium selenide/sulfide (CIGSS) absorber layers for photovoltaic applications. As will be described in detail below, the present techniques involve a spray-based deposition process, which produces substrate structure CIGSS solar cells using metal chalcogenides homogenously dissolved in hydrazine or a hydrazine-like solvent, such as ethanolamine and/or dimethyl sulfoxide (DMSO). As highlighted above, the use of a substrate structure as opposed to a superstrate structure allows for better grain growth in the CIGSS absorber layer through high temperature heat treatments without the possibility of damaging the later-formed p-n junction (i.e., between the CIGSS absorber layer and a buffer layer, see below).

In step 202, a precursor solution of metal chalcogenide dissolved in hydrazine or a hydrazine-like solvent is formed. The use of a hydrazine or hydrazine-like solvent-based metal chalcogenide precursor solution allows for the production of metal chalcogenide absorber layers that are essentially free of carbon (C), oxygen (O), chlorine (Cl), bromine (Br) and iodine (I) impurities. The precursor solution is prepared by contacting hydrazine or a hydrazine-like solvent and a source of copper (Cu), a source of indium (In), a source of gallium (Ga), a source of selenium (Se) and optionally a source of sulfur (S), under conditions sufficient to produce a homogeneous solution. For example, the precursor solution can be prepared by dissolving the metal chalcogenide in hydrazine, a hydrazine-like solvent or a mixture of a hydrazine-like solvent(s) and one or more other co-solvents such as ethanolamine and/or DMSO at near ambient temperatures (i.e., from about 10 degrees Celsius (° C.) to about 40° C.), with optionally extra chalcogen added to improve solubility.

By way of example only, a suitable precursor solution may be prepared as follows. First, four component solutions ((a)-(d)) are prepared. Component solution (a) contains four millimole (mmol) indium selenide ($In_2Se_3$) (1.886 grams (g)) and four mmol Se (0.316 g) dissolved in 12 milliliters (ml) of anhydrous hydrazine (which several days after being prepared forms a clear pale yellow and very viscous solution). Component solution (b) contains 1.5 mmol Ga (0.105 g; ground up) and three mmol of Se (0.237 g) dissolved in three ml of anhydrous hydrazine (after a week of stirring). Component solution (c) contains four mmol copper sulfide ($Cu_2S$) (0.637 g) and eight mmol S (0.256 g) dissolved in eight ml of anhydrous hydrazine, which forms a clear yellow solution. Component solution (d) contains four mmol Se (0.316 g) dissolved in two ml of hydrazine.

From these initial component solutions, a CIGSS solution can then be prepared ((which should be sufficiently stirred before spray pyrolysis) targeting a $CuIn_{1-x}Ga_xSe_2$ stoichiometry, wherein x=0.3, i.e., $CuIn_{0.7}Ga_{0.3}Se_2$) by mixing four ml of component solution (c) (containing four mmol of Cu), 4.2 ml of component solution (a) (containing 2.8 mmol In), 2.4 ml of component solution (b) (containing 1.2 mmol of Ga), 0.8 ml of component solution (d) (containing 1.6 mmol Se) and 0.8 ml hydrazine. Optional doping solutions containing sodium sulfide ($Na_2S$) or antimony trisulfide ($Sb_2S_3$) can also be added in to modify grain properties.

The precursor solution of the metal chalcogenide can be prepared using one or more of the techniques outlined in U.S. Pat. No. 7,341,917 issued to Milliron et al., entitled "Solution Deposition of Chalcogenide Films Containing Transition Metals" (wherein a precursor solution is formed by dissolving a metal chalcogenide containing at least one transition metal chalcogenide in a hydrazine compound); U.S. Patent Application No. 2007/0160747, filed by D. B. Mitzi et al., entitled "Method For Fabricating an Inorganic Nanocomposite" (which involves a solution of a soluble hydrazine-based metal chalcogenide precursor); U.S. Patent Application No. 2007/0264504, filed by D. B. Mitzi et al., entitled "Solution-Based Deposition Process For Metal Chalcogenides" (hereinafter "Mitzi 2007/0264504") (wherein a precursor solution is formed by adding an elemental metal and an elemental chalcogen to a hydrazine compound); U.S. Patent Application No. 2008/0124833, filed by R. Ruiz et al., entitled "Method For Filling Holes With Metal Chalcogenide Material" (wherein a hydrazine-based precursor to a metal chalcogenide is prepared, for example, by directly dissolving a metal chalcogenide in a hydrazine compound); U.S. Pat. No. 6,875,661 issued to D. B. Mitzi, entitled "Solution Deposition of Chalcogenide Films" (wherein a solution of a hydrazinium-based precursor of a metal chalcogenide is prepared by contacting a metal chalcogenide(s) and a hydrazine compound); U.S. Pat. No. 7,094,651 issued to D. B. Mitzi et al., entitled "Hydrazine-Free Solution Deposition of Chalcogenide Films" (hereinafter "Mitzi U.S. Pat. No. 7,094,651") (wherein a solution is formed by contacting an isolated hydrazinium-based precursor of a metal chalcogenide and a solvent having a solubilizing additive); U.S. Patent Application No. 2009/0145482, entitled "Improved Photovoltaic Device With Solution-Processed Chalcogenide Absorber Layer" (hereinafter "U.S. Patent Application No. 2009/0145482") and U.S. patent application Ser. No. 12/118,230 filed by Yuan et al., entitled "Techniques for Enhancing Performance of Photovoltaic Devices" (wherein antimony (Sb)-doping is used to improve grain structure in copper indium gallium selenium (CIGS)-based photovoltaic devices), the disclosure of each of which is incorporated by reference herein.

The precursor solution can also be prepared by directly dissolving the corresponding metal of the metal chalcogenide in hydrazine, with at least enough chalcogen added to affect the formation and dissolution of the metal chalcogenide in solution (see, for example, Mitzi 2007/0264504). Alternatively, the precursor solution can be formed by dissolving a preformed hydrazinium-based precursor in a non-hydrazine-based solvent, such as a mixture of ethanolamine and DMSO, for example, as described in Mitzi U.S. Pat. No. 7,094,651. In the cases of ternary, quaternary and compounds with more than four elements, it may be preferable to dissolve each component separately and then combine the solutions before deposition.

The present techniques provide several notable advantages over previous non-hydrazine-based solution deposition approaches. First, the present solution-based techniques do not involve oxygen or oxides and, as such, do not require a reduction and/or sulfurization/selenization high-temperature annealing process in a toxic chalcogen-containing environment. Second, the present hydrazine dissolving process does not involve C, O or Cl, and does not produce films having substantial contaminations by impurities of these elements that are commonly seen in pyrolytic processes. Third, the present solution-based spray techniques (see below) enable facile incorporation of dopants such as aluminum (Al), antimony (Sb), sodium (Na) and/or tellurium (Te). Further, convenient control of the ratio between elements can be easily achieved, and as such a better control over the film chemical composition and electrical properties is readily achieved.

In U.S. Patent Application No. 2009/0145482, CIGSS photovoltaic devices with efficiencies of up to 10.3 percent (%) were successfully demonstrated via a hydrazine-based process with spin coating being used as the deposition process. It is known that for solution-based inorganic photovoltaic processes, the problem lies in how to get the impurity free functioning materials into a homogenous solution, which is solved in the present techniques by using a strong solvent, hydrazine. By contrast, in other methods these materials cannot be directly dissolved and as a result oxides for example have to be introduced.

In step 204, spray pyrolysis in an inert environment is used to deposit the precursor solution onto a substrate to form a metal chalcogenide layer, e.g., a CIGSS thin film, on the substrate. Advantageously, the present techniques provide an improved spray pyrolysis process that can produce large area substrate structure CIGSS solar cells using the above-described hydrazine-based precursor solutions. With this improved spray pyrolysis process, the metal chalcogenide layer, e.g., CIGSS film, can be formed having a thickness of from about 100 nanometers (nm) to about ten micrometers (μm), preferably from about 200 nm to about five μm, and more preferably from about 600 nm to about two μm.

According to an exemplary embodiment, the substrate comprises molybdenum (Mo)-coated soda-lime glass, wherein the Mo serves as a back contact for the device. However, any other type of suitable photovoltaic device substrate and/or other suitable back contact material can be used. By way of example only, other suitable substrates include, but are not limited to, Mo, tungsten (W) or chromium (Cr)-coated glass, metal foil (e.g., Al foil) or polyimide sheets (such as Kapton® Polyimide Films manufactured by DuPont, Wilmington, Del. or Apical® Polyimide Films manufactured by Kaneka Texas Corporation, Pasadena, Tex.).

In the homogenous spray solution, prepared as described above, the metal precursor concentration in the solution can be from about 0.01 molar (M) to about one M, preferably from about 0.1 M to about 0.5 M. The Cu to Se ratio is generally 1:2 but extra Se can be added (e.g., from about 0.4 moles to about 0.8 moles of extra Se for every one mole of In) to compensate for the Se that can be lost during the spray and heating processes and to aid in grain growth (see below). The solution viscosity is related to metal precursor concentration and can be reduced by adding extra amounts of hydrazine. The solution viscosity should be in a reasonable range to ensure the formation of droplets and/or to prevent nozzle clogging during spraying (see below). According to an exemplary embodiment, the solution viscosity is lower than one Pascal-second (Pa·S). However, if viscous solutions are involved (i.e., having a viscosity of greater than one Pa·S), using an ultrasonication nozzle may help to improve the spray process.

According to an exemplary embodiment, the metal chalcogenide layer is formed having a composition represented by the following formula:

$$Cu_{1-y}In_{1-x}Ga_xSe_{2-z}S_z$$

wherein $0 \leq x \leq 1$; and
$0 \leq y \leq 0.15$; and
$0 \leq z \leq 2$.

The metal chalcogenide layer formation involves one or more heat treatments, i.e., during deposition and, optionally, post-deposition, which drives away the hydrazine and any excess chalcogen and allows for grain growth. The heat treatments can include heating via hot plate, oven or furnace and/or a heating process such as rapid thermal annealing (RTA), in which a temperature of the substrate is controlled. As will be described, for example, in conjunction with the description of FIGS. 4 and 5, below, the heat treatments can be performed in-situ, i.e., within the confines of a spray pyrolysis system via a heater (such as a hot plate) incorporated into the system, or alternatively, the heat treatments can be performed after the solution is sprayed (or between spray cycles, see below) by removing the device from the spray pyrolysis system and administering the heat treatment, e.g., by placing the device in an external oven or furnace.

Multiple spray deposition cycles (n number of cycles) can be employed to form the metal chalcogenide layer having the desired thickness (see above). According to an exemplary embodiment, for example, a heat treatment is included between each cycle. By way of example only, a moderate substrate heat treatment at a temperature of from about 25° C. to about 400° C. can be employed between spray cycles to drive out the remaining hydrazine solution. The duration of the heat treatment between spray cycles can be from about ten seconds to about 60 minutes, preferably from about one minute to about ten minutes. To allow maximum crystal growth, a final annealing (i.e., a post-depositional heat treatment) in an inert environment may be employed, for example, at a temperature of from about 200° C. to about 600° C. for a duration of from about 60 seconds to about 20 hours (for lower temperatures a longer time is needed wherein a duration of about 60 seconds is used, for example, for rapid thermal annealing and longer durations are used for normal heating). After final annealing, the substrate should be allowed to cool down to room temperature in a controlled inert atmosphere.

Advantageously, by employing multiple spray cycles, a composition of the precursor solution can be varied between spray cycles to obtain compositional grading within the metal chalcogenide layer. Namely, solutions with different chemical concentration can be utilized for different sprayed layers to achieve a desired grading structure (i.e., element grading). By way of example only, solutions with different Ga concentrations can be applied for different sprayed layers so as to create a graded Ga concentration, therefore achieving bandgap grading if desired.

Alternatively, a combination of a spray deposition process and other deposition processes may also be feasible to deposit the metal chalcogenide layer. An example of such a combination is to spray the precursor solution and follow up with a spin-coating process. For example, spinning the substrate after spray deposition can improve the uniformity and smoothness of the metal chalcogenide layer, as well as reduce the amount of precursor solution used overall in the deposition process.

In step 206, a buffer layer is formed adjacent to a side of the metal chalcogenide layer opposite the substrate. According to an exemplary embodiment, the metal chalcogenide layer is coated with cadmium sulfide (CdS), zinc cadmium sulfide (ZnCdS) and/or any other suitable buffer layer material using chemical bath deposition or spray technique (e.g., spray pyrolysis) to form a p-n junction with the metal chalcogenide layer. Advantageously, as highlighted above, adopting a substrate solar cell structure does not involve substantial heating of the junction during the fabrication process and therefore has the potential to produce higher efficiency devices than for the superstrate structure.

In step 208, a transparent conductive contact is formed adjacent to a side of the buffer layer opposite the metal chalcogenide layer. According to an exemplary embodiment, the transparent conductive contact is formed by first sputtering a layer of intrinsic zinc oxide (ZnO) onto the buffer layer followed by sputtering a layer of transparent conductive oxide (TCO), such as aluminum-doped ZnO and indium tin oxide (ITO), over the intrinsic ZnO layer.

In step 210, metal fingers (i.e., grid structure) are formed adjacent to a side of the transparent conductive contact opposite the buffer layer to complete the device. The grid structure facilitates current collection. According to an exemplary embodiment, the grid structure comprises nickel (Ni) and Al and is electron-beam (e-beam) evaporated through a shadow mask on top of the transparent conductive contact. Alternative methods of depositing the buffer layer and the transparent conductive contact of the device, as practiced by those skilled in the art, may also be used. By way of example only, the buffer layer and/or transparent conductive contact, like the metal chalcogenide layer, can be deposited by spraying.

FIG. 3 is a diagram illustrating exemplary methodology 300 for fabricating a photovoltaic device with a superstrate configuration. While substrate configurations provide notable advantages over superstrate configurations (such as circumventing high temperature heating of the p-n junction allowing for better CIGSS grain growth (see above)) and thus are preferred, methodology 300 illustrates how the present teachings can also be broadly implemented to fabricate a superstrate photovoltaic device for those applications wherein a superstrate device might be preferred. Methodology 300 provides an improved, low-cost, solution-based technique to grow uniform large-area CIGSS absorber layers for photovoltaic applications.

In step 302, a substrate is provided. According to an exemplary embodiment, the substrate comprises ZnO, ITO or tin oxide ($SnO_2$)-coated glass. In step 304, a buffer layer is formed on the substrate. According to an exemplary embodiment, the substrate is coated with CdS, ZnCdS and/or any other suitable buffer layer material using chemical bath deposition or a spray technique.

In step 306, a precursor solution of metal chalcogenide dissolved in hydrazine or a hydrazine-like solvent is formed. The procedures for forming the precursor solution of metal chalcogenide in hydrazine or a hydrazine-like solvent are presented in detail in conjunction with the description of FIG. 2, above, and that description is incorporated herein. As highlighted above, the use of a hydrazine or hydrazine-like solvent-based metal chalcogenide precursor solution allows for the production of metal chalcogenide absorber layers that are essentially free of C, O, Cl, Br and I impurities.

In step 308, spray pyrolysis in an inert environment is used to deposit the precursor solution onto the buffer layer to form a metal chalcogenide layer, e.g., a CIGSS thin film, adjacent to a side of the buffer layer opposite the substrate. With the present techniques, the metal chalcogenide layer, e.g., CIGSS film, can be formed having a thickness of from about 100 nm to about ten μm, preferably from about 200 nm to about five μm and more preferably from about 600 nm to about two μm.

As highlighted above, in the precursor solution the metal precursor concentration in the solution can be from about 0.01 M to about one M, preferably from about 0.1 M to about 0.5 M. The Cu to Se ratio is generally 1:2 but extra Se can be added to compensate for the Se that can be lost during the spray and heating processes and to aid in grain growth (see below). The solution viscosity is related to metal precursor concentration and can be reduced by adding extra amounts of hydrazine. The solution viscosity should be in a reasonable range to ensure the formation of droplets and/or to prevent nozzle clogging during spraying (see below). According to an exemplary embodiment, the solution viscosity is lower than one Pa·S. However, if very viscous solutions are involved, using an ultrasonication nozzle may help to improve the spray process.

According to an exemplary embodiment, the metal chalcogenide layer is formed having a composition represented by the following formula:

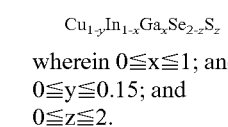

$$Cu_{1-y}In_{1-x}Ga_xSe_{2-z}S_z$$

wherein $0 \leq x \leq 1$; and
$0 \leq y \leq 0.15$; and
$0 \leq z \leq 2$.

The metal chalcogenide layer forms a p-n junction with the buffer layer adjacent thereto. As above, heat treatments are involved in forming the metal chalcogenide layer. Care must be taken to preserve the p-n junction through these heat treatments, such as minimizing the time and temperature of the heat treatments while maintaining grain size.

The heat treatments, performed during deposition and, optionally, post-deposition, serve to drive away the hydrazine and any excess chalcogen and allow for grain growth. The heat treatments can include heating via hot plate (which may be performed in situ within a spray pyrolysis system), oven or furnace and/or a heating process such as RTA, in which a temperature of the substrate is controlled.

Multiple spray deposition cycles (n number of cycles) can be employed to form the metal chalcogenide layer having the desired thickness (see above). According to an exemplary embodiment, for example, a heat treatment is included between each cycle. By way of example only, a moderate substrate heat treatment at a temperature of from about 50° C. to about 400° C. can be employed between spray cycles to drive out the remaining hydrazine solution. The duration of the heat treatment between spray cycles can be from about ten seconds to about 60 minutes, preferably from about one minute to about ten minutes. To allow maximum crystal growth, a final annealing (i.e., a post-depositional heat treatment) in an inert environment may be employed, for example, at a temperature of from about 200° C. to about 600° C. for a duration of from about 60 seconds to about 20 hours. After final annealing, the substrate should be allowed to cool down to room temperature in a controlled inert atmosphere. As highlighted above, by employing multiple spray cycles, a composition of the precursor solution can be varied between spray cycles to obtain compositional grading within the metal chalcogenide layer.

In step 310, a metal layer is formed adjacent to a side of the metal chalcogenide layer opposite the buffer layer. The metal layer will serve as a back contact of the device. According to an exemplary embodiment, the metal layer comprises one or more of molybdenum (Mo), titanium (Ti) and silver (Ag). The metal layer completes the device.

Figure 4:
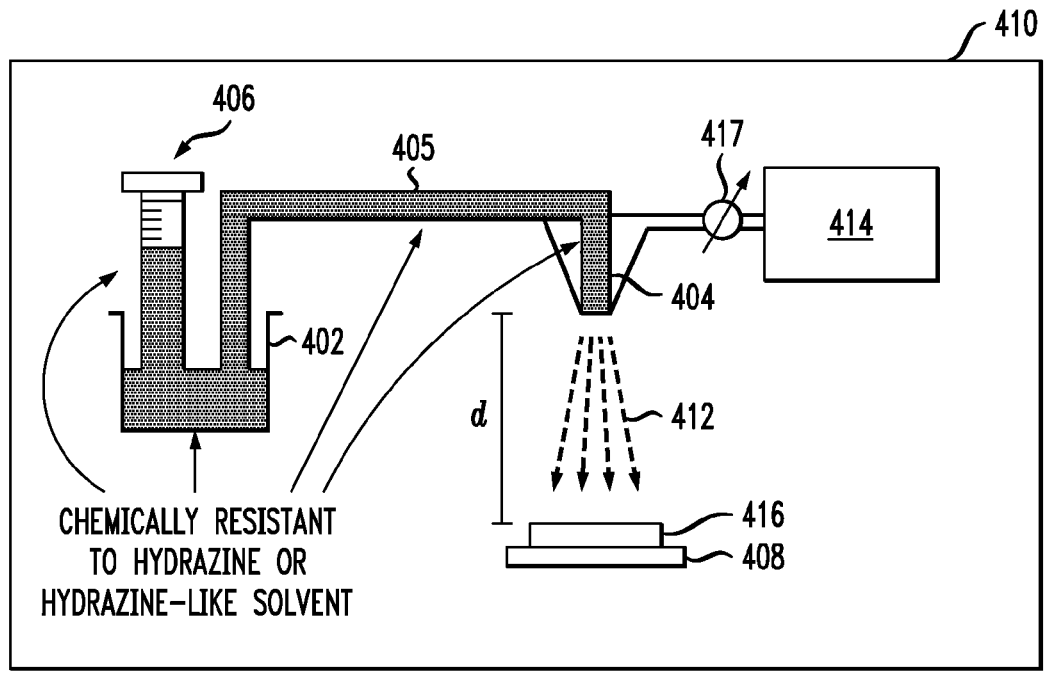
FIG. 4 is a diagram illustrating an exemplary spray pyrolysis system according to an embodiment of the present invention.

FIG. 4 is a diagram illustrating exemplary spray pyrolysis system 400. As will be described in detail below, spray pyrolysis system 400 is adapted to deposit solutions containing hydrazine (or a hydrazine-like solvent), such as the precursor solution of metal chalcogenide described in conjunction with the description of FIGS. 2 and 3, above. Thus, spray pyrolysis system 400 can be used to perform, e.g., step 204 of methodology 200 (see FIG. 2) and/or step 308 of methodology 300 (see FIG. 3). While spray pyrolysis system 400 can be broadly implemented in a variety of different deposition systems, the following description will be specifically directed to spray pyrolysis system 400 being used to deposit a hydrazine (or a hydrazine-like solvent)-based metal chalcogenide precursor solution, e.g., to produce large area substrate structure CIGSS solar cells.

Spray pyrolysis system 400 includes reservoir 402 for storing the precursor solution, nozzle 404 to receive the precursor solution from the reservoir via a fluid conduit(s) 405 (based on a flow of the precursor solution through spray pyrolysis system 400 established, for example, by action of syringe system 406) and heater 408 to heat the substrate on a side opposite onto which the precursor solution is sprayed. As will be described in detail below, the components of spray pyrolysis system 400 that come in contact with the precursor solution (e.g., the reservoir, fluid conduit(s), nozzle and syringe system) are all composed of a material chemically resistant to the hydrazine or hydrazine-like solvent, such as titanium (Ti).

Spray pyrolysis system 400 should be confined in a controlled environment. According to an exemplary embodiment, spray pyrolysis system 400 is enclosed in a nitrogen dry box, i.e., nitrogen dry box 410, with minimum water and oxygen contaminations and thus provides an inert environment required for the hydrazine-based deposition process. The hydrazine-based precursor solution is stored in a special reservoir, i.e., reservoir 402, that is made out of Ti or an alternative material that is chemically resistant to the hydrazine or hydrazine-like solvent. The precursor solution is delivered by syringe system 406 and sprayed through nozzle 404 using a carrier gas (as indicated by arrows 412). Nitrogen is compatible with the nitrogen dry box and thus is preferably used as the carrier gas. The nitrogen carrier gas is provided from nitrogen carrier gas source 414 which may be internal or external to nitrogen dry box 410. A flow of the nitrogen carrier gas from source 414 is regulated by valve 417. During deposition, a photovoltaic device structure 416, i.e., either a Mo-coated substrate (according to methodology 200, FIG. 2) or a ZnO, ITO or $SnO_2$-coated substrate/buffer layer (according to methodology 300, FIG. 3) is placed under nozzle 404 with an adjustable distance d. The distance d between nozzle 404 and photovoltaic device structure 416 can be from about five µm to about 30 centimeters (cm).

As described above, heat treatments, i.e., between spray cycles and/or a final anneal, may be performed. According to an exemplary embodiment, these heat treatments involve heating the photovoltaic device structure in-situ within system 400 to the proper temperature(s) using heater 408 placed underneath the structure. Alternatively, the heat treatments can be performed after the solution is sprayed (or between spray cycles) by removing the device from system 400 and administering the heat treatments, e.g., by placing the device in an external oven or furnace.

Special care should be taken to choose hydrazine or hydrazine-like solvent compatible materials when setting up the spray equipment. Generally, Ti is recommended for reservoir 402, nozzle 404, fluid conduit 405 (which may in some embodiments comprise a tubing system) and syringe system 406. However, other hydrazine or hydrazine-like solvent compatible materials, such as poly(tetrafluoroethylene) (PTFE), can also be utilized. Nozzle 404 can optionally comprise an ultrasonic nozzle. Using an ultrasonic spray process can afford better film uniformity and quality, better process reproducibility, reduced liquid usage (which equates to increased material utilization and thus reduced deposition costs) and less clogging issues.

As shown in FIG. 4, nozzle 404 is positioned above structure 416 and during deposition will spray the precursor solution onto substrate 416 under pressure of the nitrogen carrier gas. As will be described in detail below, spray pyrolysis system configurations are presented herein where the nozzle is positioned below the substrate and sprays the precursor solution onto the substrate under a positive voltage being applied to the nozzle. See FIG. 5, described immediately below.

Figure 5:
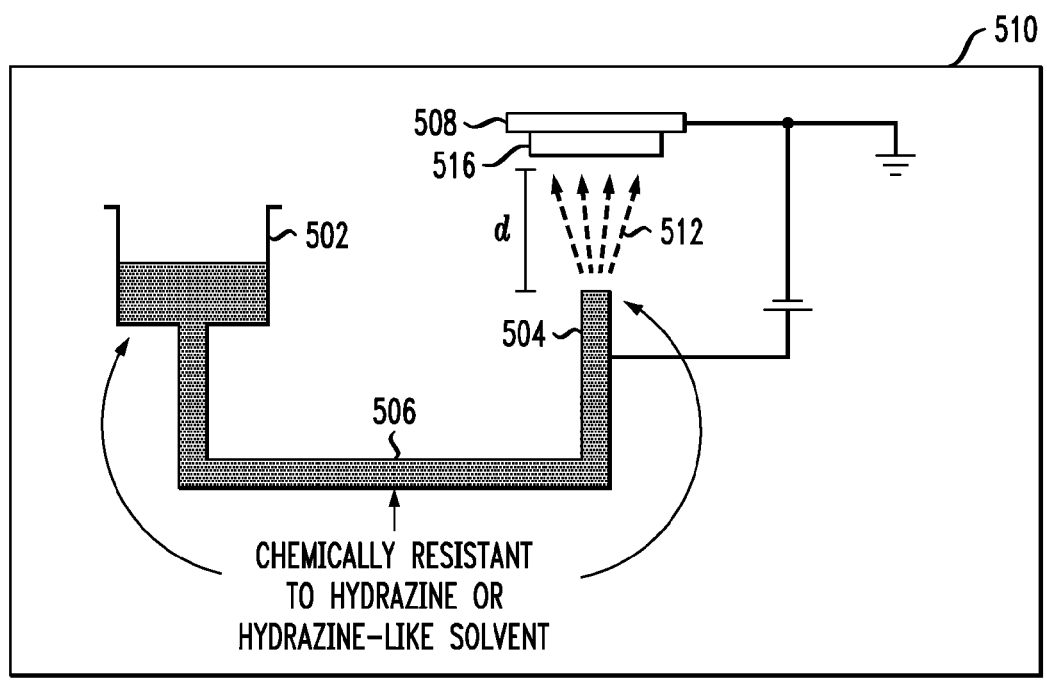
FIG. 5 is a diagram illustrating another exemplary spray pyrolysis system according to an embodiment of the present invention.

FIG. 5 is a diagram illustrating exemplary spray pyrolysis system 500. As will be described in detail below, spray pyrolysis system 500 is adapted to deposit solutions containing hydrazine (or a hydrazine-like solvent), such as the precursor solution of metal chalcogenide described in conjunction with the description of FIGS. 2 and 3, above. Thus, spray pyrolysis system 500 can be used to perform, e.g., step 204 of methodology 200 (see FIG. 2) and/or step 308 of methodology 300 (see FIG. 3). While spray pyrolysis system 500 can be broadly implemented in a variety of different deposition systems, the following description will be specifically directed to spray pyrolysis system 500 being used to deposit a hydrazine (or a hydrazine-like solvent)-based metal chalcogenide precursor solution, e.g., to produce large area substrate structure CIGSS solar cells.

Spray pyrolysis system 500 includes reservoir 502 for storing the precursor solution, nozzle 504 to receive the precursor solution from the reservoir via a fluid conduit(s) 506 and heater 508 to heat the substrate on a side opposite onto which the precursor solution is sprayed. As will be described in detail below, the components of spray pyrolysis system 500 that come in contact with the precursor solution (i.e., the reservoir, fluid conduit(s) and nozzle) are all composed of a material chemically resistant to the hydrazine or hydrazine-like solvent, such as Ti.

Spray pyrolysis system 500 should be confined in a controlled environment. According to an exemplary embodiment, spray pyrolysis system 500 is enclosed in a nitrogen dry box, i.e., nitrogen dry box 510, with minimum water and oxygen contaminations and thus provides an inert environment required for the hydrazine-based deposition process. The hydrazine-based precursor solution is stored in a special reservoir, i.e., reservoir 502, that is made out of Ti or an alternative material that is chemically resistant to the hydrazine or hydrazine-like solvent. The precursor solution is sprayed through nozzle 504 under electrostatic force (as indicated by arrows 512). Nitrogen is compatible with the nitrogen dry box and thus is preferably used as the carrier gas. During deposition, a photovoltaic device structure 516, i.e., either a Mo-coated substrate (according to methodology 200, FIG. 2) or a ZnO, ITO or $SnO_2$-coated substrate/buffer layer (according to methodology 300, FIG. 3)) is placed above nozzle 504 with an adjustable distance d.

As described above, heat treatments, i.e., between spray cycles and/or a final anneal, may be performed. According to an exemplary embodiment, these heat treatments involve heating the photovoltaic device structure in-situ within system 500 to the proper temperature(s) using heater 508 placed above the photovoltaic device structure. Alternatively, the heat treatments can be performed after the solution is sprayed (or between spray cycles) by removing the device from system 500 and administering the heat treatments, e.g., by placing the device in an external oven or furnace.

Special care should be taken to choose hydrazine or hydrazine-like solvent compatible materials when setting up the spray equipment. Generally, Ti is recommended for reservoir 502, nozzle 504 and fluid conduit 506 (which may in some embodiments comprise a tubing system). However, other hydrazine or hydrazine-like solvent compatible materials, such as PTFE, can also be utilized. Nozzle 504 can optionally comprise an ultrasonic nozzle. As described above, using an ultrasonic spray process can afford better film uniformity and quality, better process reproducibility, reduced liquid usage (which equates to increased material utilization and thus reduced deposition costs) and less clogging issues.

Spray pyrolysis system 500 is an electrospray system that utilizes electrostatic force to propel the precursor solution. An electrospray pyrolysis system is advantageous over conventional spray systems as it provides increased material utilization and improved film uniformity. Further, unlike conventional spray systems, spray pyrolysis system 500 is hydrazine or hydrazine-like solvent compatible.

During deposition, the precursor solution is sprayed upward toward photovoltaic device structure 516. Spraying the precursor solution upward toward the photovoltaic device structure prevents dust and other contaminants from falling onto the structure. Instead of using a carrier gas to spray out the precursor solution (as in spray pyrolysis system 400 above), the electrospray setup of spray pyrolysis system 500 applies high positive voltage on the nozzle. Under the electrostatic force, the droplets of the spray are ejected from the nozzle and deposit onto the photovoltaic device structure. With this technique, a better material utilization and film morphology control can be achieved.

During the electrospray process, the photovoltaic device structure is grounded and a voltage from about 100 volts (V) to about 15 kilovolts (kV) is applied on the nozzle. The distance d between the nozzle and the photovoltaic device structure can be from about five μm to about 30 cm.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a photovoltaic device, the method comprising the steps of:
   forming a precursor solution of metal chalcogenide dissolved in a solvent selected from the group consisting of hydrazine, ethanolamine and dimethyl sulfoxide;
   using spray pyrolysis in an inert environment to deposit the precursor solution onto a substrate to form a metal chalcogenide layer on the substrate;
   forming a buffer layer adjacent to a side of the metal chalcogenide layer opposite the substrate; and
   forming a transparent conductive contact adjacent to a side of the buffer layer opposite the metal chalcogenide layer.

2. The method of claim 1, wherein the metal chalcogenide comprises a copper indium gallium selenide material, and wherein the step of forming a precursor solution further comprises the step of:
   contacting the solvent and a source of copper, a source of indium, a source of gallium and a source of selenium.

3. The method of claim 1, wherein the step of using spray pyrolysis to deposit the precursor solution further comprises the step of:
   heating the substrate to a temperature of from about 25 degrees Celsius to about 400 degrees Celsius while the precursor solution is being deposited.

4. The method of claim 1, wherein the substrate comprises glass, metal foil or a polyimide sheet coated with molybdenum, tungsten or chromium.

5. The method of claim 1, wherein the metal chalcogenide layer is formed having a thickness of from about 100 nanometers to about 10 micrometers.

6. The method of claim 1, wherein the metal chalcogenide layer is formed having a thickness of from about 200 nanometers to about five micrometers.

7. The method of claim 1, wherein the metal chalcogenide layer is formed having a thickness of from about 600 nanometers to about two micrometers.

8. The method of claim 1, wherein the precursor solution has a viscosity of less than one Pascal-second.

9. The method of claim 1, wherein a concentration of the metal chalcogenide in the precursor solution is from about 0.01 molar to about one molar.

10. The method of claim 1, wherein a concentration of the metal chalcogenide in the precursor solution is from about 0.1 molar to about 0.5 molar.

11. The method of claim 1, wherein the step of using spray pyrolysis to deposit the precursor solution further comprises the steps of:
    depositing the precursor solution onto the substrate to form the metal chalcogenide layer having a thickness that is less than a desired thickness; and
    repeating the depositing step for n number of cycles until the desired thickness for the metal chalcogenide layer is achieved.

12. The method of claim 11, further comprising the step of:
    varying a composition of the precursor solution between deposition cycles to obtain compositional grading within the metal chalcogenide layer.

13. The method of claim 11, wherein the solvent comprises hydrazine and wherein the method further comprises the step of:
    heating the substrate to a temperature of from about 25 degrees Celsius to about 400 degrees Celsius between deposition cycles to remove any remaining hydrazine from the metal chalcogenide layer.

14. The method of claim 13, further comprising the step of:
    performing a final anneal of the substrate after a last deposition cycle at a temperature of from about 200 degrees Celsius to about 600 degrees Celsius for a duration of from about 60 seconds to about 20 hours.

15. The method of claim 1, wherein the step of forming the buffer layer further comprises the step of:
    depositing the buffer layer over the metal chalcogenide layer using chemical bath deposition or spray pyrolysis.

16. The method of claim 1, wherein the buffer layer comprises one or more of cadmium sulfide and zinc cadmium sulfide.

17. The method of claim 1, wherein the step of forming the transparent conductive contact further comprises the steps of:
    sputtering a layer of intrinsic zinc oxide onto the buffer layer; and
    sputtering a layer of transparent conductive oxide onto the intrinsic zinc oxide layer.

18. A method for fabricating a photovoltaic device, the method comprising the steps of:
    providing a substrate;
    forming a buffer layer on the substrate;
    forming a precursor solution of metal chalcogenide dissolved in a solvent selected from the group consisting of hydrazine, ethanolamine and dimethyl sulfoxide;
    using spray pyrolysis in an inert environment to deposit the precursor solution onto the buffer layer to form a metal chalcogenide layer adjacent to a side of the buffer layer opposite the substrate; and
    forming a metal layer adjacent to a side of the metal chalcogenide layer opposite the buffer layer to complete the photovoltaic device.

19. The method of claim 18, wherein the substrate comprises glass coated with intrinsic zinc oxide, indium tin oxide or tin oxide.

20. A spray pyrolysis system comprising:

a reservoir adapted for storing a precursor solution of metal chalcogenide dissolved in a solvent selected from the group consisting of hydrazine, ethanolamine and dimethyl sulfoxide;

a nozzle adapted to receive the precursor solution from the reservoir via one or more fluid conduits and spray the precursor solution onto one or more photovoltaic device structures, wherein the reservoir, conduits and nozzle are composed of a material selected from the group consisting of titanium and poly(tetrafluoroethylene) which is chemically resistant to the solvent; and a heater adapted to heat the photovoltaic device structure on a side opposite onto which the precursor solution is sprayed.

21. The spray pyrolysis system of claim 20, being contained in a nitrogen dry box.

22. The spray pyrolysis system of claim 20, wherein the nozzle is located at an adjustable distance from the photovoltaic device structure.

23. The spray pyrolysis system of claim 20, wherein the nozzle is oriented above the photovoltaic device structure and is adapted to spray the precursor solution onto the photovoltaic device structure under pressure of a carrier gas.

24. The spray pyrolysis system of claim 20, wherein the nozzle is oriented below the photovoltaic device structure and is adapted to spray the precursor solution onto the photovoltaic device structure under a positive voltage being applied to the nozzle.

* * * * *